United States Patent [19]

Schinella et al.

[11] 3,911,168

[45] Oct. 7, 1975

[54] METHOD FOR FORMING A CONTINUOUS LAYER OF SILICON DIOXIDE OVER A SUBSTRATE

[75] Inventors: Richard D. Schinella, Mountain View; Michael P. Anthony, San Carlos, both of Calif.

[73] Assignee: Fairchild Camera and Instrument Corporation, Mountain View, Calif.

[22] Filed: June 1, 1973

[21] Appl. No.: 365,882

[52] U.S. Cl. .................... 427/93; 427/86; 427/94

[51] Int. Cl.[2] .................... B44D 1/14

[58] Field of Search .......... 117/215, 201, 118, 106, 117/106 A, DIG. 12

[56] References Cited

UNITED STATES PATENTS

| | | | |
|---|---|---|---|
| 3,304,200 | 2/1967 | Statham | 117/201 |
| 3,385,729 | 5/1968 | Larchian | 117/215 |
| 3,479,237 | 11/1969 | Bergh et al. | 117/215 |
| 3,791,882 | 2/1974 | Ogive | 117/215 |
| 3,793,090 | 2/1974 | Barile | 117/201 |

*Primary Examiner*—Cameron K. Weiffenbach
*Attorney, Agent, or Firm*—Alan H. MacPherson; Norman E. Reitz; Roger S. Borovoy

[57] ABSTRACT

The method of this invention involves forming polycrystalline silicon on a substrate and subsequently converting the polycrystalline silicon into silicon dioxide.

5 Claims, 2 Drawing Figures

METHOD FOR FORMING A CONTINUOUS LAYER OF SILICON DIOXIDE OVER A SUBSTRATE

BACKGROUND OF THE INVENTION

1. Field of the Invention

This invention relates to a novel method of forming a layer of silicon dioxide upon a semiconductor substrate by first depositing polycrystalline silicon upon the substrate and then converting the polycrystalline silicon into silicon dioxide.

2. Description of Prior Art

In the manufacture of many semiconductor devices, for example, integrated circuits, it is desirable to deposit or form a layer of silicon dioxide upon one or another surface of the semiconductor substrate. If this substrate surface includes steep or re-entrant angles (i.e., a step with an overhang), it is difficult to deposit layers of substantially uniform thickness.

Some of the prior art discloses the formation by direct depositon of a coating of silicon dioxide upon a hot substrate. This is accomplished by the decomposition of a silicon halide or silane in a hot oxidizing ambient atmosphere. Such atmosphere may comprise, for example, water, oxygen, nitric oxide or carbon monoxide. This prior art is represented by, for example, U.S. Pat. Nos. 3,306,768 to Peterson, 3,304,200 to Stratham, 3,396,052 to Rand, and 3,625,749 to Yoshioka. Unfortunately, this technique of forming a layer of silicon dioxide often causes nodular type structures to occur at surface defects. These nodular structures of silicon dioxide usually break off during handling of the substrate, exposing regions of the underlying semiconductor substrate. These exposed regions are susceptible to damage in later manufacturing processes, for example, by etches. Further, metal films deposited upon a dielectric overlying the substrate may electrically contact the substrate through voids in the dielectric film. Another mode of failure common to the direct gas phase deposition process is the formation of microcrack defects. These occur when silicon dioxide layers are deposited over abrupt steps on a substrate. These microcrack defects are similar to the microcrack defects observed in layers of evaporated metal, for example, aluminum, adjacent abrupt steps.

Other prior art discloses a deposited polycrystalline silicon layer which is subsequently surface-coated with a film of silicon nitride or silicon dioxide. This is typified by U.S. Pat. No. 3,189,973 to Edwards and U.S. Pat. No. 3,651,385 to Kobayashi.

SUMMARY OF THE INVENTION

This invention is directed to a method of depositing or forming a substantially uniform layer of silicon dioxide upon a semiconductor substrate. This substrate may include re-entrant steps or other irregular surface features. Further, the method of this invention utilizes a sequential formation process to provide a relatively defect-free, high quality silicon dioxide coating. This coating is susceptible to a minimum of crazing and thickness variation.

The method by which the silicon dixoide is formed includes coating a semiconductor substrate surface with silicon dioxide by first depositing a polycrystalline silicon layer. Then the layer is completely converted to silicon dioxide, for example, by oxidation or anodization. This process may be contrasted with the prior art oxide coating methods which disclose a direct coating with silicon dioxide by the thermal decomposition of silane or silicon halide in the presence of steam, oxygen, nitric oxide, or carbon monoxide. Further, the present invention distinguishes from those of the prior art by completely oxidizing the initially deposited layer of polycrystalline silicon.

DESCRIPTION OF THE PREFERRED EMBODIMENT

Figure 1:
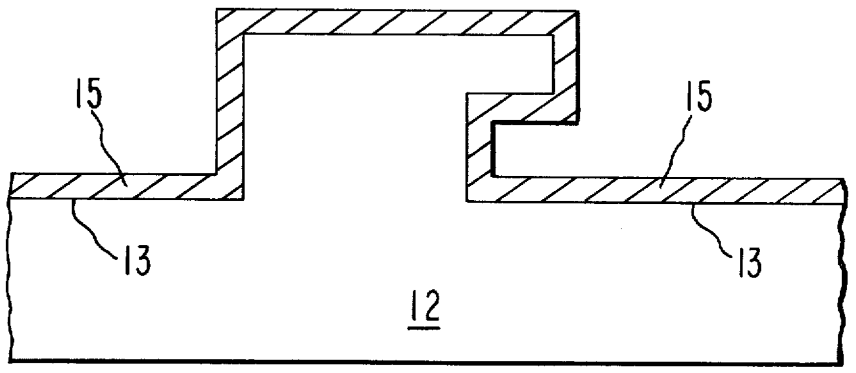
FIG. 1 shows a semiconductor substrate having a reentrant step transversed by a substanially uniform layer of polycrystalline silicon.

FIG. 1 shows a cross-section of a semiconductor substrate 12. This substrate may be any selected material; for example, it may be a single material, or a composite material, or a laminate of materials. In particular, it may be a semiconductor material on which dielectric material (typically but not necessarily other than silicon or silicon dioxide) has been formed. According to the method of this invention a layer of polycrystalline silicon 15 is formed on substrate 12. In contrast with the gas phase reactions of the prior art as typified by U.S. Pat. No. 3,306,768 to Peterson, polycrystalline silicon 15 is deposited upon the surface 13 of substrate 12 by a surface-reaction-initiated deposition process. This reaction may be carried out in any one of a number of well-known methods, one of which will be described. The surface-reaction-initiated deposition of polycrystalline silicon 15 may be accomplished by heating the substrate 12 and passing a gas containing a silicon compound over the substrate 12. This gas may, for example, contain silicon tetrachloride, monochlorosilane, dichlorosilane, trichlorosilane, or silane in an appropriate carrier gas which does not react with these chemicals. The gas phase silicon compound, upon coming into contact with the heated surface 13, decomposes into silicon and a gas. The result is a substantially uniform layer of polycrystalline silicon 15 which is deposited upon the semiconductor substrate 12. Surprisingly, polycrystalline silicon layer 15 covers all exposed portions of surface 13, including the underside of any overhanging portions of the substrate as shown in FIG. 1, substantially uniformly. The surface-reaction-initiated deposition also may be accomplished by supplying energy to the substrate 12 in other ways, for example, by using ultravoilet energy or rf plasma.

Figure 2:
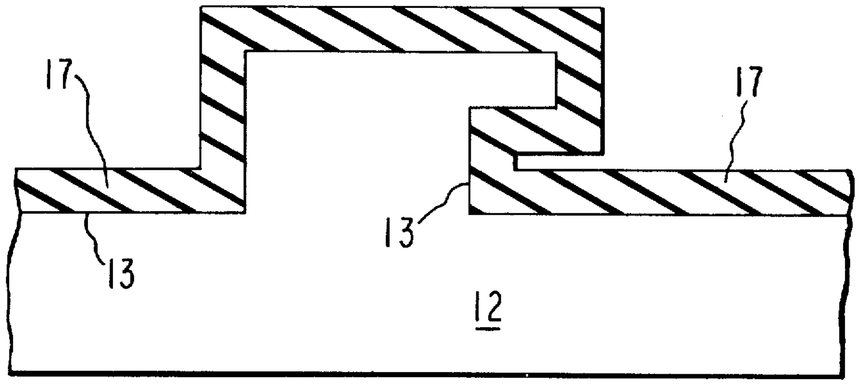
FIG. 2 shows the substrate of FIG. 1 following conversion of the polycrystalline silicon into silicon dioxide.

Once the polycrystalline silicon layer 15 reaches the desired thickness, this process is terminated, and the deposited silicon layer 15 is converted into silicon dioxide, for example by thermal oxidation or anodization. The resulting cross-section is shown in FIG. 2. Because polycrystalline silicon layer 15 is substantially uniform in thickness, silicon dioxide 17 formed from polycrystalline silicon layer 15 uniformly covers large steps and re-entrants on the substrate surface. 13, as shown in FIG. 2.

Several advantages are associated with the layers of silicon dioxide 17 formed in the above-described manner. First, polycrystalline silicon 15 can be deposited immediately after deposition of a dielectric upon semiconductor material in a continuous operation without the unnecessary exposure of the substrate 12 to dust or any other atmospheric contamination. As a result, the silicon dioxide layer 17 formed by the conversion of the polycrystalline silicon layer 15 will be more defect-free than if deposited on atmospherically contaminated surfaces. Second, the silicon dioxide layer 17 formed according to this invention is not prone to failure over substrate steps. This is because of the improved uniformity of thickness of the silicon dioxide layer 17 resulting from the method of this invention. Third, the method of this invention, because it reduces the number of failures due to silicon dioxide layer discontinuities at abrupt or re-entrant steps in a substrate surface 13, is suitable for application to high-density, integrated circuit devices. These devices, when formed using conventional silicon dioxide film deposition technologies, were prone to failures due to cracks in the oxide and resulting short circuits at these steps.

In one embodiment polycrystalline silicon was formed from the decomposition of silane at 750°C to a thickness of 0.1 microns immediately upon the termination of formation of and over, a silicon nitride layer. This avoids the accumulation of atmospheric contaminants on the surface of the silicon nitride. Then the wafer containing the polycrystalline silicon was oxidized in steam at 1000°C for 30 minutes to completely convert the polycrystalline silicon into silicon dioxide. The resulting silicon dioxide was essentially amorphous. Because the polycrystalline silicon covers substantially uniformly steps and all sides of overhangs, the silicon dioxide likewise extends over these objects in substantially uniform thickness. Vapor deposited silicon dioxide, on the contrary, would not adequately cover overhanging or sharp steps.

What is claimed is:

1. A method for forming a continuous layer of silicon dioxide on all portions of an irregular substrate surface comprising the sequential steps of:

forming a layer of polycrystalline silicon upon said surface of said substrate; and completely converting all of said layer of polycrystalline silicon to silicon dioxide by the steps of:

applying an oxidizing agent; and providing thermal energy to said substrate for a sufficient period of time to effect the oxidation of said layer of polycrystalline silicon.

2. A method as in claim 1 wherein the conversion of the polycrystalline silicon layer to silicon dioxide is accomplished by thermal oxidation.

3. A method of claim 1 including the first step of forming a layer of silicon nitride on a semiconductor wafer and then immediately thereafter forming said layer of polycrystalline silicon.

4. A method as in claim 1 wherein the layer of polycrystalline silicon is formed by surface reaction initiated deposition.

5. A method as in claim 4 wherein the surface reaction initiated deposition is accomplished using thermal energy.

* * * * *